United States Patent
Aangenent et al.

(10) Patent No.: US 9,897,926 B2
(45) Date of Patent: Feb. 20, 2018

(54) STAGE POSITIONING SYSTEM AND LITHOGRAPHIC APPARATUS

(71) Applicant: ASML Netherlands B.V., Veldhoven (NL)

(72) Inventors: Wilhelmus Henricus Theodorus Maria Aangenent, Eindhoven (NL); Lucas Franciscus Koorneef, Eindhoven (NL); Theo Anjes Maria Ruijl, Eindhoven (NL); Stanley Constant Johannes Martinus Van Den Berg, Veldhoven (NL); Stan Henricus Van Der Meulen, Eindhoven (NL); Jan Van Eijk, Eindhoven (NL); Pieter Hubertus Godefrida Wullms, Veldhoven (NL); Richard Henricus Adrianus Van Lieshout, Batenburg (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/115,876

(22) PCT Filed: Jan. 20, 2015

(86) PCT No.: PCT/EP2015/050950
§ 371 (c)(1),
(2) Date: Aug. 1, 2016

(87) PCT Pub. No.: WO2015/113861
PCT Pub. Date: Aug. 6, 2015

(65) Prior Publication Data
US 2017/0010543 A1    Jan. 12, 2017

(30) Foreign Application Priority Data

Jan. 31, 2014 (EP) ..................... 14153404
Mar. 24, 2014 (EP) ..................... 14161344

(51) Int. Cl.
*B64C 17/06* (2006.01)
*F16M 7/00* (2006.01)
(Continued)

(52) U.S. Cl.
CPC .......... *G03F 7/70716* (2013.01); *G03F 7/709* (2013.01); *G03F 7/70758* (2013.01); *H01L 21/68* (2013.01)

(58) Field of Classification Search
CPC .. G03F 7/70716; G03F 7/70758; G03F 7/709; H01L 21/68
(Continued)

(56) References Cited

U.S. PATENT DOCUMENTS

| | | | | |
|---|---|---|---|---|
| 5,237,018 A * | 8/1993 | Sorathia | ............. | C08F 283/006 525/131 |
| 6,283,041 B1 * | 9/2001 | Ono | ....................... | B82Y 10/00 108/20 |

(Continued)

FOREIGN PATENT DOCUMENTS

| | | |
|---|---|---|
| CN | 101446771 | 6/2009 |
| JP | 07-325628 | 12/1995 |

(Continued)

OTHER PUBLICATIONS

Singapore Search Report and Written Opinion dated Mar. 16, 2017 in corresponding Singapore Patent Application No. 11201606276Q.
(Continued)

*Primary Examiner* — Colin Kreutzer
(74) *Attorney, Agent, or Firm* — Pillsbury Winthrop; Shaw Pittman LLP (57) ABSTRACT

A stage positioning system, includes a first body, a second body and a coupling arranged to couple the first body and the second body to each other. The coupling includes a viscoelastic element arranged to couple the first body and the
(Continued)

second body to each other. The stage positioning system may further include a sensor to provide a signal representative of a position of the first body. The stage positioning system may further include an actuator to move the first body. The second body may be arranged to couple the actuator and the coupling to each other.

20 Claims, 6 Drawing Sheets (51) Int. Cl.
*G03B 27/58* (2006.01)
*G03B 27/62* (2006.01)
*H02K 41/02* (2006.01)
*G03F 7/20* (2006.01)
*H01L 21/68* (2006.01)

(58) Field of Classification Search
USPC ............ 248/636, 638; 310/12.05, 12.06; 318/649; 355/72, 75
See application file for complete search history.

(56) References Cited

U.S. PATENT DOCUMENTS

| | | | |
|---|---|---|---|
| 6,906,786 | B2 | 6/2005 | Cox et al. |
| 7,903,328 | B2 | 3/2011 | Yamana |
| 8,164,737 | B2 | 4/2012 | Butler et al. |
| 8,629,410 | B2 | 1/2014 | Tsuji et al. |
| 8,928,860 | B2 | 1/2015 | Hempenius et al. |
| 8,932,042 | B2 | 1/2015 | Vermeulen et al. |
| 2003/0166776 | A1 | 9/2003 | Wright et al. |
| 2004/0008331 | A1 | 1/2004 | Cox et al. |
| 2007/0052143 | A1 | 3/2007 | Emoto et al. |
| 2008/0278828 | A1 | 11/2008 | Rau et al. |
| 2009/0122284 | A1 | 5/2009 | Butler et al. |
| 2009/0147356 | A1 | 6/2009 | Yamana |
| 2009/0231567 | A1* | 9/2009 | Hempenius ............. G03F 7/707 355/67 |
| 2010/0214548 | A1* | 8/2010 | Vervoordeldonk . G03F 7/70758 355/72 |
| 2011/0235014 | A1 | 9/2011 | Arai |
| 2012/0091362 | A1 | 4/2012 | Tsuji et al. |

FOREIGN PATENT DOCUMENTS

| | | |
|---|---|---|
| JP | 09-174373 | 7/1997 |
| JP | H09-174373 | 7/1997 |
| JP | 2001-221733 | 5/2001 |
| JP | 2003-217998 | 7/2003 |
| JP | 2004-134745 | 4/2004 |
| JP | 2009-052985 | 3/2009 |
| JP | 2009-105398 | 5/2009 |
| JP | 2009-200488 | 9/2009 |
| JP | 2012-134485 | 7/2012 |
| JP | 5251869 | 7/2013 |
| WO | 2007/138168 | 12/2007 |

OTHER PUBLICATIONS

International Search Report and Written Opinion dated Apr. 8, 2015 in corresponding International Patent Application No. PCT/EP2015/050950.
Kazuaki Saiki et al., "Positioning of Large-Scale High-Precision Viscoelastic Stage Based on Vibration Suppression PTC," 35$^{th}$ Annual Conference of IEEE Industrial Electronics, pp. 3136-3141 (Nov. 3-5, 2009).
Japanese Office Action dated Aug. 1, 2017 in corresponding Japanese Patent Application No. 2016-549473.
Chinese Office Action dated Apr. 27, 2017 in corresponding Chinese Patent Application No. 201580013489.9.
Korean Office Action dated Dec. 15, 2017 in corresponding Korean Patent Application No. 10-2016-7023789.

* cited by examiner

STAGE POSITIONING SYSTEM AND LITHOGRAPHIC APPARATUS

CROSS-REFERENCE TO RELATED APPLICATIONS

This application is the U.S. national phase entry of PCT patent application no. PCT/EP2015/050950, which was filed on Jan. 20, 2015, which claims the benefit of priority of EP patent application no. 14153404.0, which was filed on Jan. 31, 2014, and also claims the benefit of priority of EP patent application no. 14161344.8, which was filed on Mar. 24, 2014, each of which is incorporated herein in its entirety by reference.

FIELD OF THE INVENTION

The invention relates to a stage positioning system and a lithographic apparatus comprising the stage positioning system.

BACKGROUND ART

A lithographic apparatus is an apparatus that can be used in the manufacture of integrated circuits (ICs). In that instance, a patterning device, which is alternatively referred to as a mask or a reticle, may be used to generate a circuit pattern to be formed on an individual layer of the IC. This pattern can be transferred by a radiation beam via a projection system onto a target portion on a substrate, such as a silicon wafer. Transfer of the pattern is typically performed via imaging onto a layer of radiation-sensitive material provided on the substrate.

The lithographic apparatus typically has a stage positioning system to move the substrate or the patterning device relative to the projection system. The patterning device is moved relative to the projection system and is scanned through the radiation beam to transfer the complete pattern onto the substrate. The substrate is moved relative to the projection system to subsequently transfer the pattern onto adjacent target portions on the substrate.

SUMMARY OF THE INVENTION

To increase the productivity of the lithographic apparatus, there is a trend to improve the stage positioning system so as to achieve a higher speed and a higher acceleration. However, the higher speed and higher acceleration requires a controller that can operate at a higher bandwidth. The bandwidth of such a controller is limited by a dominant natural frequency of the stage positioning system. Increasing the bandwidth beyond this limit would cause the controller to be unstable.

It is an objective of the invention to provide a stage positioning system that is less sensitive to the dominant natural frequency of the stage positioning system.

In a first aspect of the invention, there is provided a stage positioning system, comprising a first body, a second body and a coupling arranged to couple the first body and the second body to each other. The coupling comprises a visco-elastic element arranged to couple the first body and the second body to each other.

According to the first aspect of the invention, the visco-elastic element is connected to the first body and to the second body. Since the visco-elastic element is connected to both the first body and the second body, the visco-elastic element is able to reduce an amplitude of a dominant natural frequency of the first body, of the second body or of the dynamical system formed by the first body, the second body and the coupling. By reducing the amplitude, the stage positioning system is made less sensitive to the dominant natural frequency.

In a second embodiment of the invention, the stage positioning system comprises a sensor and an actuator. The sensor is to provide a signal representative of a position of the first body. The actuator is to move the first body. The second body is arranged to couple the actuator and the coupling to each other.

According to the second embodiment of the invention, the actuator is a source of vibrations. Some of these vibrations may be sensed by the sensor. The vibrations sensed by the sensor may cause the sensor to provide a signal that is not accurately representing a position of the first body. Since the coupling is in a path between the actuator and the sensor, the vibrations caused by the actuator and sensed by the sensor propagate via the coupling. Since those vibrations propagate via the coupling, the visco-elastic element is able to dampen from those vibrations a vibration that would resonate the first body at the dominant natural frequency.

In a third embodiment of the invention, the second body comprises the actuator.

According to the third embodiment of the invention, the second body comprises the actuator. The mass of the actuator is often significant in comparison to the mass of the first body. The significant mass of the second body in combination with the coupling causes damping of the first body over a large frequency range. The damping over the large frequency range is advantageous to damp multiple dominant natural frequencies. By making the actuator part of the second body, no additional mass is required to achieve damping over the large frequency range.

In a fourth embodiment of the invention, the actuator comprises a reluctance actuator.

According to the fourth embodiment of the invention, there is a gap between two parts of the reluctance actuator. The two parts are movable relative to each other. One of the two parts can be considered a stator, the other of the two parts can be considered a mover. The stator and the mover cooperate together to create a force. It is desirable to minimize the gap, because decreasing the gap increases the efficiency of the reluctance actuator. However, in case of a crash of the stage positioning system, the two parts of the reluctance actuator may collide with each other. By having the reluctance actuator coupled to the coupling with the visco-elastic element, the visco-elastic element may absorb some or all of the energy caused by the collision. Additional energy absorbers may be omitted and the gap may be minimized.

In a fifth embodiment of the invention, the stage positioning system comprises a long-stroke module. The long-stroke module is arranged to move the actuator relative to the projection system. The actuator is arranged to move the first body relative to the long-stroke module.

According to the fifth embodiment of the invention, the long-stroke module can move the actuator over a large range relative to the projection system. The actuator can move the first body over a small range relative to the long-stroke module. Since the range of the actuator can be small, the actuator can be optimized for accurate movement. Since the actuator moves relative to the long-stroke module, the long-stroke module does not have to move accurately, so the long-stroke module can be optimized for movement over a large range. By using the long-stroke module, the first body can be moved over a large range at a high accuracy.

In a sixth embodiment of the invention, the coupling comprises an elastic element. The elastic element is arranged to couple the first body and the second body to each other in parallel to the visco-elastic element.

According to the sixth embodiment of the invention, the visco-elastic element may have insufficient stiffness to couple the first body and the second body to each other with enough stiffness at low frequencies, which are lower than the dominant natural frequency. The elastic element has a stiffness that is frequency-independent at the frequency range of interest, so the stiffness of the elastic element may be selected to achieve a sufficient amount of stiffness between the first body and the second body at low frequencies.

In a seventh embodiment of the invention, the visco-elastic element has a frequency-dependent stiffness. The frequency-dependent stiffness is characterized by a glass transition region. The first body forms a dynamical system characterized by a dominant natural frequency. The dominant natural frequency lies in the glass transition region at an operating temperature of the stage positioning system.

According to the seventh aspect of the invention, an excitation of the stage positioning system may cause the first body to vibrate at the dominant natural frequency. Since the first body and the second body are coupled to each other via the coupling, the vibration of the first body will at least partly propagate via the coupling. Since the dominant natural frequency lies in the glass transition region, the visco-elastic element is able to dampen the vibration, because the visco-elastic element has a high damping at the glass transition region. By damping the vibration, the amplitude of the vibration is decreased. By decreasing the amplitude of the vibration, the stage positioning system has been made less sensitive to the dominant natural frequency.

In an eighth embodiment of the invention, the elastic element has a stiffness having a first value. The frequency-dependent stiffness is characterized by a glass region. The frequency-dependent stiffness is characterized by a rubber region. The frequency-dependent stiffness has a second value at a second frequency. The second frequency lies in the rubber region at the operating temperature of the stage positioning system. The frequency-dependent stiffness has a third value at a third frequency. The third frequency lies in the glass region at the operating temperature of the stage positioning system. The second frequency is lower than the dominant natural frequency. The third frequency is higher than the dominant natural frequency. The first value is larger than the second value. The first value is smaller than the third value.

According to the eighth embodiment of the invention, the glass transition region is in the frequency range around the dominant natural frequency. Even if the frequency of the dominant natural frequency is not correctly predicted when manufacturing the stage positioning system, the dominant natural frequency would still be lying in the glass transition region. As a result, a vibration having a frequency of a shifted dominant natural frequency would still be damped effectively. The dominant natural frequency may be predicted using a dynamical model. The parameters of such a dynamical model may include the masses and stiffnesses of components of the stage positioning system. Inaccuracies in predicting the values of the parameters may cause the dominant natural frequency to occur at a somewhat different frequency than expected.

In a ninth embodiment of the invention, the frequency-dependent stiffness has a fourth value at the dominant natural frequency. The fourth value is larger than the first value.

According to the ninth embodiment of the invention, the visco-elastic element is stiffer at the dominant natural frequency than the elastic element at the dominant natural frequency. Since the visco-elastic element is stiffer than the elastic element, most of the energy of a vibration having the dominant natural frequency will propagate between the first body and the second body via the visco-elastic element and not via the elastic element. Since most energy propagates via the visco-elastic element, the visco-elastic element is able to dampen a large part of the vibration.

In a tenth embodiment of the invention, the first body, the second body and the coupling together form a further dynamical system having a further natural frequency. The further natural frequency corresponds to a resonance mode that is substantially determined by a deformation of the coupling. The dominant natural frequency (fn) is equal to the further natural frequency.

According to the tenth embodiment of the invention, a vibration having the further natural frequency that vibrates the stage positioning system causes the stage positioning system to resonate at the further natural frequency. Since the further natural frequency is equal to the dominant natural frequency, the first body will also resonate at the dominant natural frequency. Since the further natural frequency corresponds to a resonance mode that is substantially determined by a deformation of the coupling, the visco-elastic element is able to dampen a large part of the vibration having the dominant natural frequency.

In an eleventh aspect of the invention, there is provided a lithographic apparatus comprising a support structure, a projection system, a substrate table and the stage positioning system according to one of the embodiments described above. The support structure is for supporting a patterning device having a pattern. The projection system is for projecting the pattern on a substrate. The substrate table is for holding the substrate. The first body comprises one of the support structure and the substrate table.

According to the second aspect of the invention, the one of the support structure and the substrate table is made less sensitive to the dominant natural frequency. Due to the reduced sensitivity to the dominant natural frequency, the support structure or substrate table can be positioned more accurately relative to the projection system. The improved positioning accuracy improves the quality of the integrated circuits made using the lithographic apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
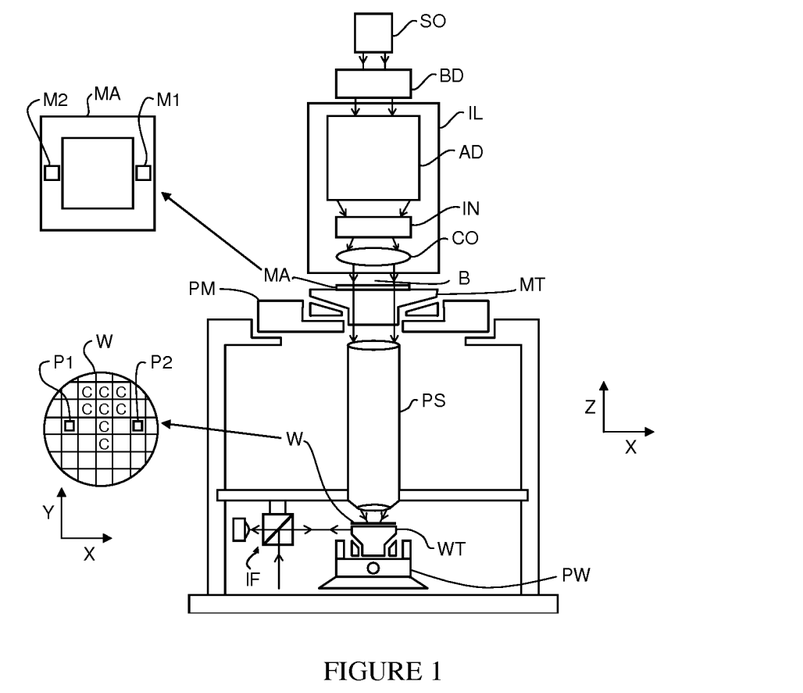
FIG. 1 depicts a lithographic apparatus according to the invention.

FIG. 1 schematically depicts a lithographic apparatus with a positioning system according to the invention. The apparatus may comprise an illumination system IL, a support structure MT, a substrate table WT and a projection system PS.

The illumination system IL is configured to condition a radiation beam B. The illumination system IL may include various types of optical components, such as refractive, reflective, magnetic, electromagnetic, electrostatic or other types of optical components, or any combination thereof, for directing, shaping, or controlling radiation.

The illumination system IL receives a radiation beam from a radiation source SO. The radiation source SO and the lithographic apparatus may be separate entities, for example when the radiation source SO is an excimer laser. In such cases, the source is not considered to form part of the lithographic apparatus and the radiation beam B is passed from the radiation source SO to the illumination system IL with the aid of a beam delivery system BD comprising, for example, suitable directing mirrors and/or a beam expander. In other cases the radiation source SO may be an integral part of the lithographic apparatus, for example when the radiation source SO is a mercury lamp. The radiation source SO and the illumination system IL, together with the beam delivery system BD if required, may be referred to as a radiation system.

The illumination system IL may comprise an adjuster AD for adjusting the angular intensity distribution of the radiation beam. In addition, the illumination system IL may comprise various other components, such as an integrator IN and a condenser CO. The illumination system IL may be used to condition the radiation beam B, to have a desired uniformity and intensity distribution in its cross section.

The term "radiation beam B" used herein encompasses all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure (e.g. a mask table) MT is for supporting a patterning device (e.g. a mask or reticle) MA. The support structure MT is connected to a first stage positioning system PM configured to accurately position the patterning device MA in accordance with certain parameters.

The support structure MT supports, i.e. bears the weight of the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device MA" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam B will correspond to a particular functional layer in a device being created in the target portion C, such as an integrated circuit.

The patterning device MA may be transmissive or reflective. Examples of a patterning device MA include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions. The tilted mirrors impart a pattern in a radiation beam which is reflected by the mirror matrix. As here depicted, the apparatus is of a transmissive type, which employs a transmissive mask.

The substrate table WT, e.g. a wafer table, is for holding a substrate W, e.g. a resist coated wafer. The substrate table WT is connected to a second stage positioning system PW configured to accurately position the substrate W in accordance with certain parameters.

The projection system PS is configured to project a pattern imparted to the radiation beam B by patterning device MA onto a target portion C of the substrate W.

The term "projection system PS" used herein should be broadly interpreted as encompassing any type of projection system PS, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

Figure 6:
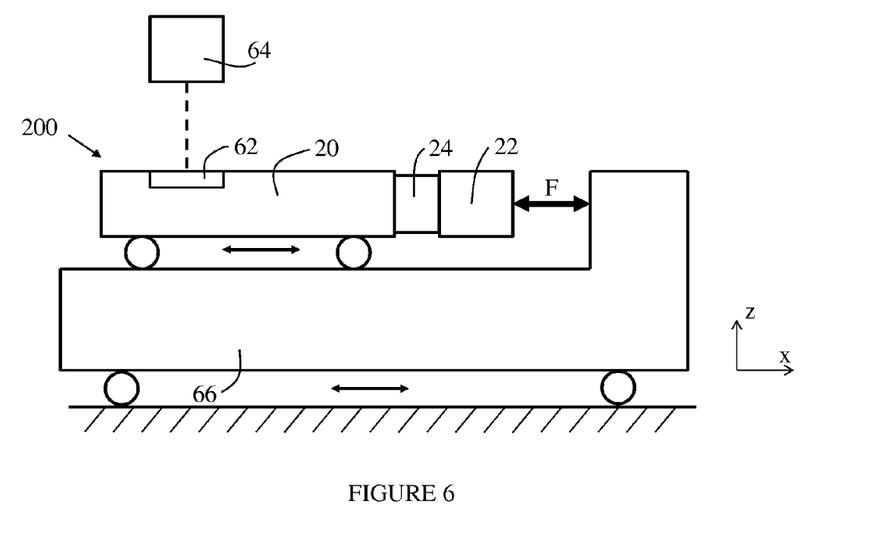
FIG. 6 depicts a stage positioning system according to a further embodiment of the invention.

The radiation beam B is incident on the patterning device MA and is patterned by the patterning device MA. Having traversed the patterning device MA, the radiation beam B passes through the projection system PS which focuses the radiation beam B onto a target portion C of the substrate W. With the aid of the second stage positioning system PW and position sensor IF (e.g. an interferometric device, linear encoder or capacitive sensor), the substrate table WT can be moved accurately, e.g. so as to position different target portions C in the path of the radiation beam B. Similarly, the first stage positioning system PM and another position sensor (which is not depicted in FIG. 1) can be used to accurately position the patterning device MA with respect to the path of the radiation beam B. In general, movement of the support structure MT may be realized with the aid of a long-stroke module and a short-stroke module. The long-stroke module provides coarse positioning of the short-stroke module relative to the projection system PS over a long range. The short-stroke module provides fine positioning of the patterning device MA relative to the long-stroke module over a small range. Similarly, movement of the substrate table WT may be realized using a long-stroke module and a short-stroke module, which form part of the second stage positioning system PW. FIG. 6 discloses in a further embodiment of a long-stroke module 66. In the case of a stepper (as opposed to a scanner) the support structure MT may be connected to a short-stroke actuator only, or may be fixed.

Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. Similarly, in situations in which more than one die is provided on the patterning device MA, the mask alignment marks M1, M2 may be located between the dies.

The lithographic apparatus may be of a type having two or more substrate tables WT and/or two or support structures MT. In addition to the at least one substrate table WT, the lithographic apparatus may comprise a measurement table, which is arranged to perform measurements but is not arranged to hold a substrate W.

The lithographic apparatus may also be of a type wherein at least a portion of the substrate may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

The depicted lithographic apparatus could be used in at least one of the following three modes:

In the first mode, the so-called step mode, the support structure MT and the substrate table WT are kept essentially stationary, while an entire pattern imparted to the radiation beam B is projected onto a target portion C at one time. The substrate table WT is then shifted in the X and/or Y direction so that a different target portion C can be exposed.

In the second mode, the so-called scan mode, the support structure MT and the substrate table WT are scanned synchronously while a pattern imparted to the radiation beam B is projected onto a target portion C. The velocity and direction of the substrate table WT relative to the support structure MT may be determined by the (de-)magnification and image reversal characteristics of the projection system PS.

In the third mode, the support structure MT is kept essentially stationary holding a programmable patterning device MA. The substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device MA, such as a programmable minor array of a type as referred to above.

Combinations and/or variations on the above described modes of use or entirely different modes of use may also be employed.

Figure 2:
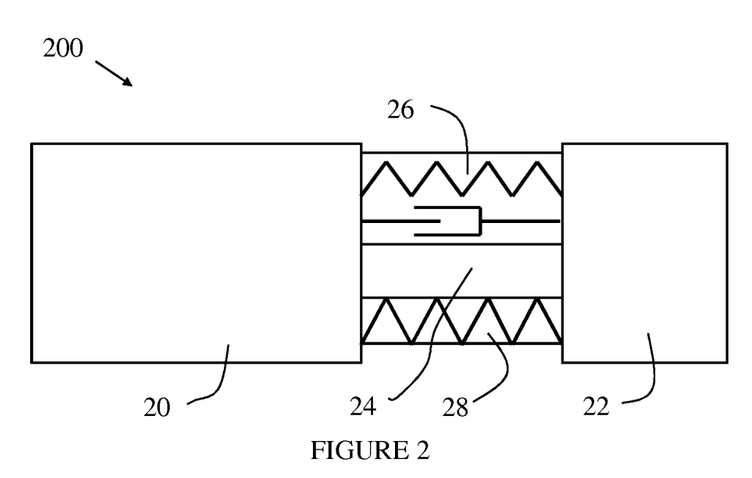
FIG. 2 depicts a stage positioning system according to an embodiment of the invention.

FIG. 2 depicts a first embodiment of the invention. FIG. 2 shows a stage positioning system 200, which may be the first stage positioning system PM or the second stage positioning system PW. The stage positioning system 200 comprises a first body 20, a second body 22 and a coupling 24. The coupling 24 couples the first body 20 and the second body 22 to each other. The coupling 24 comprises a visco-elastic element 26 that couples the first body 20 and the second body 22 to each other.

The visco-elastic element 26 may have any form or shape suitable to connect the first body 20 and the second body 22 to each other. The visco-elastic element 26 may be shaped like a disc or as a beam. The visco-elastic element 26 has a visco-elastic material. In addition to the visco-elastic material, the visco-elastic element 26 may comprise a material that is not visco-elastic, for example a metal. The visco-elastic material may be connected to the material that is not visco-elastic, for example by vulcanizing. The material that is not visco-elastic may be used to create an interface with the first body 20 and/or the second body 22.

Even though the first body 20 is depicted as a simple block, in reality, the first body 20 may form a dynamical system having a dynamical behavior. The dynamical behavior of the first body 20 determines how the first body 20 vibrates in response to a force applied to the first body 20. The vibrations may be mostly vibrations that deform the first body 20 instead of vibrations that move the first body 20 as a rigid body. Alternatively or in addition, the second body 22 may form a dynamical system having a dynamical behavior.

The dynamical behavior of the dynamical system is characterized by a dominant natural frequency. When a vibration is applied to the stage positioning system 200 with a frequency of or close to the dominant natural frequency, the amplitude of the vibration is increased. The increase of the amplitude causes the stage positioning system 200 to resonate at the dominant natural frequency.

The stage positioning system 200 may have many natural frequencies. The lowest natural frequency may be for example around 100 Hz or 500 Hz. The highest natural frequencies may be higher than 10000 Hz. However, natural frequencies beyond a certain frequency do not substantially influence the dynamical behavior of the stage positioning system 200. Also, a natural frequency may correspond to a natural vibration that does not negatively influence the performance of the stage positioning system 200.

The invention is aimed at reducing the influence of a dominant natural frequency. The dominant natural frequency can be a natural frequency that limits the positioning accuracy with which the stage positioning system can be positioned. The dominant natural frequency can be a natural frequency that limits the bandwidth of a controller that is arranged to control a position of the first body 20. The dominant natural frequency can be a frequency at which the first body 20 and second body 22 dynamically decouple from each other. The dominant natural frequency can be a natural frequency that limits the life time of the stage positioning system 200. For example, a vibration of the stage positioning system 200 at the natural frequency may cause fatigue of a material of which the stage positioning system 200 is made. In summary, the dominant natural frequency is a natural frequency that limits the performance of the stage positioning system 200.

Figure 3:
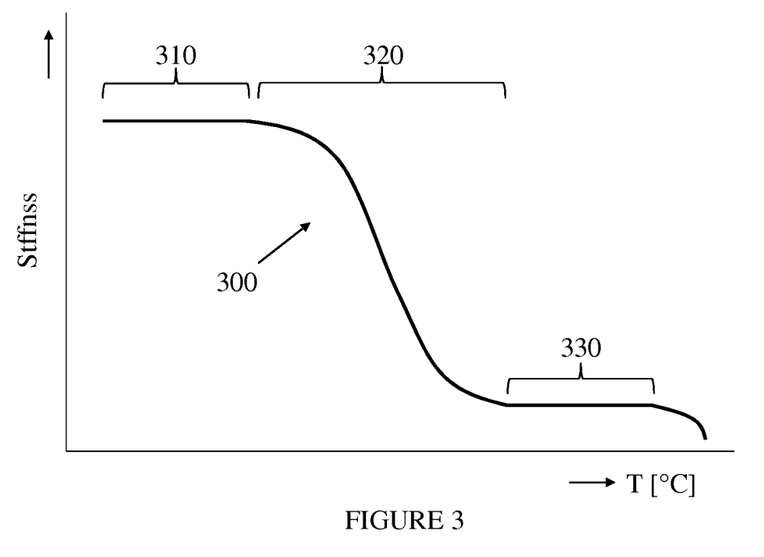
FIG. 3 depicts in a graph the frequency-dependent stiffness of the visco-elastic element.

FIG. 3 depicts in a graph the stiffness of the visco-elastic element 26 in dependency of the temperature T, in for example degrees Centigrade. It is well-known that the stiffness of visco-elastic elements depends on the temperature. It is also well-known that the stiffness of visco-elastic elements is frequency-dependent. Therefore, the stiffness of the visco-elastic element 26 is referred to as frequency-dependent stiffness 300. In the graph of FIG. 3, the line representing the frequency-dependent stiffness 300 has three different regions that can be distinguished. At a low temperature, the visco-elastic element 26 is in a glass region 310. In the glass region 310, the stiffness of the visco-elastic element 26 is high compared to the other regions. In the glass region 310, the value of the frequency-dependent stiffness 300 does not substantially change per unit of the temperature T. At a high temperature, the visco-elastic element 28 is in a rubber region 330. In the rubber region 330, the stiffness of the visco-elastic element 26 is low compared to the other regions. In the rubber region 330, the value of the frequency-dependent stiffness 300 does not substantially change per unit of the temperature T. Between the glass region 310 and the rubber region 330, there is a glass transition region 320. In the glass transition region 320, the value of the frequency-dependent stiffness 300 varies substantially more per unit of temperature than in the glass region 310 and the rubber region 330.

Figure 4:
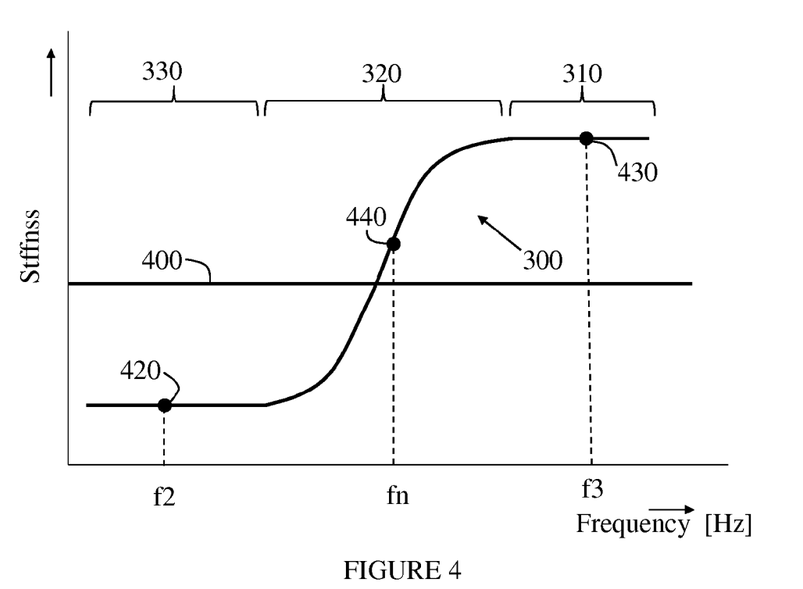
FIG. 4 depicts in a graph the frequency-dependent stiffness of the visco-elastic element.

FIG. 4 depicts in a graph the frequency-dependent stiffness 300 of the visco-elastic element 26 in dependency of the frequency in Hertz [Hz]. The frequency on the horizontal axis of the graph is the frequency at which the visco-elastic element 26 is deformed. It is well-known that the dependency of the frequency-dependent stiffness 300 on the frequency is inverse to the dependency of the frequency-dependent stiffness 300 on the temperature. Further explanation about the dependency of the frequency-dependent stiffness 300 on frequency and temperature can be found in Handbook of Viscoelastic vibration damping by David L. G. Jones, 2001, ISBN 13: 9780471492481. At a low frequency, the visco-elastic element 26 is in the rubber region 330. At a high frequency, the visco-elastic element 26 is in the glass region 310. Between the glass region 310 and the rubber region 330, the visco-elastic element 26 is in the glass transition region 320. The absolute values of the frequency-dependent stiffness 300 in the graph depend on the temperature of the visco-elastic element 26. An increase in temperature of the visco-elastic element 26 shifts the curve in the graph to the right, i.e., the start of the glass transition region 320 is shifted to a higher frequency. A decrease in temperature of the visco-elastic element 26 shifts the curve in the graph to the left, i.e., the start of the glass transition region 320 is shifted to a lower frequency. Also, the absolute values of the frequency-dependent stiffness 300 depend on the dimensions of the visco-elastic element 26. For example, to increase the frequency-dependent stiffness 300, the cross-section of the visco-elastic element 26 can be increased.

The embodiment of FIG. 2 may be provided with an elastic element 28. The elastic element 28 is arranged to couple the first body 20 and the second body 22 to each other in parallel to the visco-elastic element 26. The elastic element 28 may have any suitable form or shape to connect the first body 20 and the second body 22 to each other. The form may be a plate or a beam or a strut. The elastic element 28 may comprise multiple separate parts. The elastic element 28 may couple the first body 20 and the second body 22 to each other in one or more degrees of freedom, for example in 6 degrees of freedom. The visco-elastic element 26 may at least partly surround the elastic element 28. The visco-elastic element 26 may completely surround the elastic element 28. Alternatively, the elastic element 28 may at least partly surround the visco-elastic element 26. The elastic element 28 may surround the visco-elastic element 26 so as to isolate the visco-elastic element 26 from the ambient environment. The ambient environment may be a vacuum. By surrounding the visco-elastic element 26, the elastic element 28 may prevent particles or gas from the visco-elastic element 26 to enter the ambient environment. The visco-elastic element 26 and the elastic element 28 may be connected to each other, for example by vulcanizing The stiffness 400 of the elastic element 28 is depicted in FIG. 4. The stiffness 400 of the elastic element 28 is substantially independent of the frequency. The absolute value of the stiffness 400 of the elastic element 28 can be set by setting the dimensions of the elastic element 28. For example, to increase the stiffness 400 of the elastic element 28, the cross-section of the elastic element 28 can be increased.

The frequency-dependent stiffness 300 has a value 420 at frequency f2. Frequency f2 lies in the rubber region 330 at an operating temperature of the stage positioning system 200. The frequency-dependent stiffness 300 has a value 430 at frequency f3. Frequency f3 lies in the glass region 310 at the operating temperature of the stage positioning system 200. FIG. 4 shows the dominant natural frequency fn. The dominant natural frequency fn lies in the glass transition region 320 at the operating temperature of the stage positioning system 200. The frequency-dependent stiffness 300 has a value 440 at the dominant natural frequency fn.

Since the value of the frequency-dependent stiffness 300 changes significantly over the glass transition region 320, the visco-elastic element 26 causes damping for vibrations with a frequency that lies in the glass transition region 320. The visco-elastic element 26 dampens a vibration that deforms the visco-elastic element 26 and that has a frequency in the glass transition region 320. Since the dominant natural frequency fn lies in the glass transition region 320, the visco-elastic element 26 is able to dampen a vibration with the dominant natural frequency fn.

In an embodiment, the frequency f2 is lower than the dominant natural frequency fn. The frequency f3 is higher than the dominant natural frequency fn. The value 420 is lower than the value 440. The value 430 is higher than the value 440.

The absolute value of the frequency-dependent stiffness 300 may depend on the geometry of the visco-elastic element 26. In an example, the visco-elastic element 26 is shaped as a plate. The plate has a stiffness along an axis parallel to the main surface of the plate. The stiffness along an axis parallel to the main surface of the plate is different than a stiffness of the plate along a further axis perpendicular to the main surface of the plate. Also, the absolute value of the frequency-dependent stiffness 300 may depend on the way how a force is introduced to the visco-elastic element 26.

In an embodiment, the value 440 of the frequency-dependent stiffness 300 is higher than the stiffness 400 of the elastic element 28.

Figure 5:
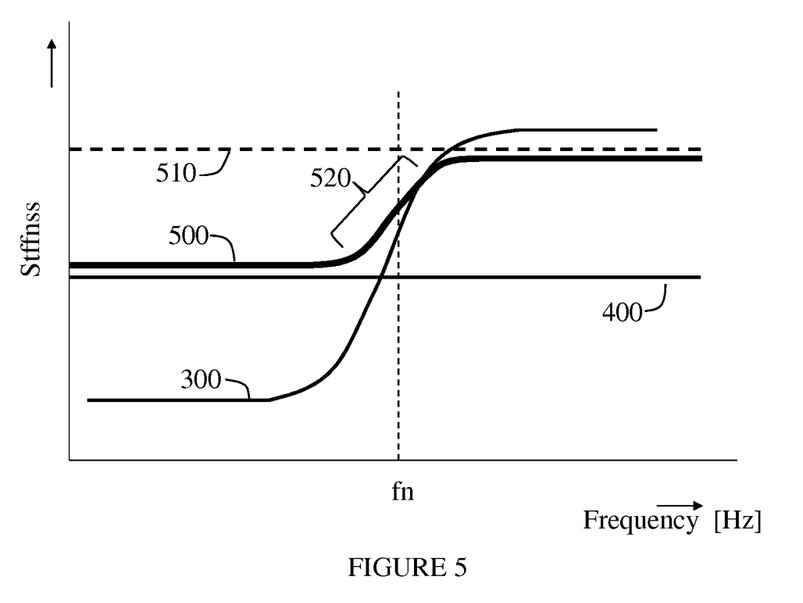
FIG. 5 depicts in a graph the stiffness of the coupling.

FIG. 5 depicts in a graph the stiffness 500 of the coupling 24. The stiffness 500 is a combination of the frequency-dependent stiffness 300 and the stiffness 400 of the elastic element 28. FIG. 5 also shows the frequency-dependent stiffness 300 and the stiffness 400 of the elastic element 28. At low frequencies, the stiffness 400 is substantially higher than the frequency-dependent stiffness 300, so the stiffness 500 is substantially equal to the stiffness 400. At high frequencies, the value of the frequency-dependent stiffness 300 is substantially higher than the value of the stiffness 400. In principle, the value of the stiffness 500 would be equal to the value of the frequency-dependent stiffness 300. However, the value of the stiffness 500 is limited to a value 510. Value 510 may be determined by several stiffnesses. An example is the stiffness of the implementation of the connection between the coupling 24 and the first body 20. The implementation of the connection may comprise a layer of glue that has a limited stiffness.

Stiffness 500 is characterized by a region 520. In region 520, the stiffness 500 is determined in a large amount by the visco-elastic element 26. The elastic element 28 and the visco-elastic element 26 may be dimensioned in such a way that the dominant natural frequency fn lies in the area 520.

The first body 20, the second body 22 and the coupling 24 together may form a further dynamical system. The further dynamical system has a further dynamical behavior. The further dynamical behavior determines how the first body 20 and the second body 22 vibrate in response to a force applied to the stage positioning system 200. The further dynamical behavior is frequency-dependent, meaning that depending on the frequency at which the force is applied to the stage positioning system 200, the amplitude of the vibration of the stage positioning system 200 may be different.

The further dynamical system is characterized by a further natural frequency. The dominant natural frequency fn depends on the stiffness of the first body 20 and the second body 22, on the mass of the first body 20 and the second body 22, on the mass of the coupling 24, on the stiffness 400 of the elastic element 28 and on the frequency-dependent stiffness 300 of the visco-elastic element 26. By setting these dependencies, the dominant natural frequency can be made equal to the further natural frequency fn. For example, the stiffness 400 of the elastic element 28 may be adjusted to make the dominant natural frequency equal to the further natural frequency fn. In another example, the mass of the second body 22 is adjusted.

FIG. 6 depicts a further embodiment of the stage positioning system 200 according to the invention. The further embodiment may have all the features of the embodiments described above. In addition, the stage positioning system 200 has a reference 62, a sensor 64 and a long-stroke module 66.

The reference 62 is connected to the first body 20. The sensor 64 is not connected to the first body 20. The sensor 64 may be connected to a frame, for example a stationary frame or for example a frame that supports the projection system PS. The sensor 64 cooperates with the reference 62 to provide a signal representative of a position of the first body 20. Alternatively, the sensor 64 is connected to the first body 20, and the reference 62 is not connected to the first body 20. The sensor 64 may comprise position sensor IF. The sensor 64 may be an interferometric and the reference 62 may comprise a mirror. The sensor 64 may be an encoder-type sensor, and the reference 62 may comprise a grating. The encoder-type sensor may provide a signal representative of a position of the first body 20 in one degree of freedom or in multiple degrees of freedom.

The second body 22 may comprise an actuator that is arranged to move the first body 20. The actuator may provide a force F between the second body 22 and the long-stroke module 66. The actuator may comprise two parts that are movable relative to each other and that cooperate together to create the force F. The two parts may be a magnet and a coil. The second body 22 may comprise or may be connected to one of the two parts. The other of the two parts may be connected to the long-stroke module 66. The long-stroke module 66 is arranged to move the actuator relative to a reference, such as the projection system PS, for example along the x-axis. The actuator is arranged to move the first body 20 relative to the long-stroke module 66, for example along the x-axis. The actuator may comprise a reluctance actuator, a Lorentz actuator or any other type of actuator that can generate a force. The actuator may comprise an actuator that moves the first body 20 by applying a displacement to the first body 20, such as a piezo actuator or a ball screw spindle.

In an embodiment, the first body 20 is a mount for mounting the sensor 64 or the reference 62 onto the second body 22.

In an embodiment the sensor 64 or the reference 62 is coupled to the first body 20. The actuator is connected to the second body 22. The coupling 24 couples the first body 20 and the second body 22 to each other.

The first body 20 may comprise or support one of the support structure MT and the substrate table WT. In an embodiment, the first body 20 is integrated with one of the support structure MT and the substrate table WT.

The stage positioning system 200 as described above may also be suited for use in an apparatus other than a lithographic apparatus. For example, the stage positioning system 200 may be used in a microscope. The first body 20 may be used to move a substrate W that is to be inspected via the microscope. The stage positioning system 200 may be used in an inspection tool for inspecting a property of an exposed substrate W. The first body 20 may be used to move the substrate W. The stage positioning system 200 may be used in any type of apparatus in which the first body 20 is to be moved relative to a reference.

Although specific reference may be made in this text to the use of a lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The substrate W may be processed, before or after the transfer of the pattern onto the substrate, in for example a track, a metrology tool and/or an inspection tool. A track is a tool that typically applies a layer of resist to a substrate W and develops the resist that has been exposed to the radiation beam B. Further, the substrate W may be processed more than once, for example in order to create a multi-layer IC, so that the term substrate W used herein may also refer to a substrate W that already contains multiple processed layers.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below;

What is claimed:

1. A stage positioning system, comprising:
   a first body;
   a second body;
   an actuator configured to move the first body; and
   a coupling arranged to couple the first body and the second body to each other,
   wherein the coupling comprises a visco-elastic element arranged to couple the first body and the second body to each other and to transmit to the first body a force of the actuator to move the first body, and the second body is arranged to couple the actuator and the coupling to each other, and
   wherein the coupling comprises an elastic element arranged to couple the first body and the second body to each other in parallel to the visco-elastic element.

2. The stage positioning system of claim 1, comprising a sensor to provide a signal representative of a position of the first body.

3. The stage positioning system of claim 1, wherein the second body comprises the actuator.

4. The stage positioning system of claim 1, wherein the actuator comprises a reluctance actuator.

5. The stage positioning system of claim 1, comprising a long-stroke module, wherein the long-stroke module is arranged to move the actuator, and the actuator is arranged to move the first body relative to the long-stroke module.

6. The stage positioning system of claim 1, wherein the visco-elastic element has a frequency-dependent stiffness, the frequency-dependent stiffness is characterized by a glass transition region, the first body forms a dynamical system characterized by a dominant natural frequency, and the dominant natural frequency lies in the glass transition region at an operating temperature of the stage positioning system.

7. The stage positioning system of claim 6, wherein:
the elastic element has a stiffness having a first value,
the frequency-dependent stiffness is characterized by a glass region,
the frequency-dependent stiffness is characterized by a rubber region,
the frequency-dependent stiffness has a second value at a second frequency,
the second frequency lies in the rubber region at the operating temperature of the stage positioning system,
the frequency-dependent stiffness has a third value at a third frequency,
the third frequency lies in the glass region at the operating temperature of the stage positioning system,
the second frequency is lower than the dominant natural frequency,
the third frequency is higher than the dominant natural frequency,
the first value is larger than the second value, and
the first value is smaller than the third value.

8. The stage positioning system of claim 7, wherein the frequency-dependent stiffness has a fourth value at the dominant natural frequency, and wherein the fourth value is larger than the first value.

9. The stage positioning system of claim 6,
wherein the first body, the second body and the coupling together form a further dynamical system having a further natural frequency,
wherein the further natural frequency corresponds to a resonance mode that is substantially determined by a deformation of the coupling, and
wherein the dominant natural frequency is equal to the further natural frequency.

10. A lithographic apparatus comprising:
a support structure configured to support a patterning device having a pattern,
a projection system configured to project the pattern on a substrate,
a substrate table configured to hold the substrate,
the stage positioning system of claim 1,
wherein the first body comprises the support structure or the substrate table.

11. The lithographic apparatus of claim 10, wherein the second body comprises the actuator.

12. The lithographic apparatus of claim 10, wherein the actuator comprises a reluctance actuator.

13. The lithographic apparatus of claim 10, comprising a long-stroke module, wherein the long-stroke module is arranged to move the actuator, and the actuator is arranged to move the first body relative to the long-stroke module.

14. The lithographic apparatus of claim 10, wherein the visco-elastic element has a frequency-dependent stiffness, the frequency-dependent stiffness is characterized by a glass transition region, the first body forms a dynamical system characterized by a dominant natural frequency, and the dominant natural frequency lies in the glass transition region at an operating temperature of the stage positioning system.

15. The stage positioning system of claim 2, wherein the first body comprises a mount configured to mount the sensor or a reference arranged to cooperate with the sensor.

16. The stage positioning system of claim 1, wherein the elastic element is arranged to at least partly surround the visco-elastic element.

17. The stage positioning system of claim 1, wherein the visco-elastic element is arranged to at least partly surround the elastic element.

18. A method comprising:
using an actuator of a stage positioning system to move a first body of the stage positioning system, wherein a coupling of the stage positioning system couples the first body to a second body of the stage positioning system and wherein the coupling comprises a visco-elastic element coupling the first body and the second body to each other and arranged to transmit to the first body a force of the actuator to move the first body, and the second body couples the actuator and the coupling to each other and wherein the coupling comprises an elastic element arranged to couple the first body and the second body to each other in parallel to the visco-elastic element.

19. A stage positioning system, comprising:
a first body;
a second body;
an actuator configured to move the first body; and
a coupling arranged to couple the first body and the second body to each other,
wherein the coupling comprises a visco-elastic element arranged to couple the first body and the second body to each other, and the second body is arranged to couple the actuator and the coupling to each other,
wherein the visco-elastic element has a frequency-dependent stiffness, the frequency-dependent stiffness is characterized by a glass transition region, the first body forms a dynamical system characterized by a dominant natural frequency, and the dominant natural frequency lies in the glass transition region at an operating temperature of the stage positioning system, and
wherein the first body, the second body and the coupling together form a further dynamical system having a further natural frequency, the further natural frequency corresponds to a resonance mode that is substantially determined by a deformation of the coupling and the dominant natural frequency is essentially equal to the further natural frequency.

20. The stage positioning system of claim 19, wherein the visco-elastic element is arranged to transmit to the first body a force of the actuator to move the first body.

* * * * *